US011862554B2

(12) United States Patent
Sugioka et al.

(10) Patent No.: US 11,862,554 B2
(45) Date of Patent: Jan. 2, 2024

(54) APPARATUSES AND METHODS OF CONTROLLING HYDROGEN SUPPLY IN MEMORY DEVICE

(71) Applicant: Micron Technology, Inc., Boise, ID (US)

(72) Inventors: Shigeru Sugioka, Hiroshima (JP); Keizo Kawakita, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/366,972

(22) Filed: Jul. 2, 2021

(65) Prior Publication Data

US 2023/0005837 A1  Jan. 5, 2023

(51) Int. Cl.
*H01L 23/522* (2006.01)
*H10B 12/00* (2023.01)

(52) U.S. Cl.
CPC ..... *H01L 23/5223* (2013.01); *H10B 12/0335* (2023.02); *H10B 12/315* (2023.02); *H10B 12/50* (2023.02)

(58) Field of Classification Search
None
See application file for complete search history.

(56) References Cited

U.S. PATENT DOCUMENTS

| | | | | |
|---|---|---|---|---|
| 5,747,830 A | * | 5/1998 | Okita | G02F 1/136209 249/111 |
| 2002/0039835 A1 | | 4/2002 | Balsan et al. | |
| 2015/0187775 A1 | * | 7/2015 | Yamamoto | H10B 12/50 257/43 |
| 2017/0256411 A1 | * | 9/2017 | Park | H01L 21/76849 |
| 2019/0279860 A1 | * | 9/2019 | Siddiqui | C23C 16/56 |
| 2020/0152634 A1 | * | 5/2020 | Lee | H01L 21/02164 |
| 2021/0375877 A1 | * | 12/2021 | Kim | H10B 12/34 |
| 2021/0376292 A1 | * | 12/2021 | Choi | H10K 50/844 |
| 2022/0216208 A1 | * | 7/2022 | Manabe | H10B 12/50 |

FOREIGN PATENT DOCUMENTS

JP   2014099551 A   5/2014

OTHER PUBLICATIONS

Lee, Jong-Min et al., "Novel Approach for the Reduction of Leakage Current Characteristics of 20 nm DRAM Capacitors With ZrO2-Based High-k Dielectrics", IEEE Electron Device Letters, vol. 38, No. 11, Nov. 2017.
Yin, Z. et al., "Effects of Hydrogen in Passivation PECVD Nitride Film on DRAM Refresh Performance", IEEE Workshop on Microelectronics and Electron Devices, Apr. 16, 2004.

\* cited by examiner

*Primary Examiner* — Steven M Christopher
(74) *Attorney, Agent, or Firm* — Dorsey & Whitney LLP (57) ABSTRACT

Apparatuses and methods for controlling hydrogen supply in manufacturing memory devices are described. An example apparatus includes: a first capacitor disposed above a substrate; a hydrogen supply film above the first capacitor; a second capacitor above the hydrogen supply film; and a barrier film between the hydrogen supply film and the second capacitor. The hydrogen supply film provides hydrogen and/or hydrogen ions. The barrier film is hydrogen-impermeable.

22 Claims, 8 Drawing Sheets

APPARATUSES AND METHODS OF CONTROLLING HYDROGEN SUPPLY IN MEMORY DEVICE

BACKGROUND

High data reliability, high speed of memory access, lower power consumption and reduced chip size are features that are demanded from semiconductor memory. Recently in semiconductor memory devices such as dynamic random access memories (DRAMs), static RAMs (SRAMs), flash memories, increased memory capacity has been desired. To increase memory capacity while maintaining or reducing chip size, areas for compensation capacitors for memory cells has been limited. Thus, some compensation capacitors may be disposed in the back-end-of-line (BEOL). For example, the compensation capacitors may be metal-in-metal (MIM) capacitors including an insulating film of high-k material having a high dielectric constant as compared to silicon dioxide ($SiO_2$).

Memory cells of memory devices can experience defects leading to errors and/or failures. Some electrically active defects in interfaces, such as silicon (Si)/silicon dioxide ($SiO_2$), are considered to be major factors of leakage currents and degradation of refresh rates. Supplying hydrogen to the interfaces of the memory cells may deactivate the defects by saturating dangling bonds of amorphous silicon. High temperature annealing in hydrogen-nitrogen ($H_2$-$N_2$) ambient has been commonly used to supply hydrogen in a later stage of the BEOL. However, the high temperature annealing in the BEOL may affect characteristics of transistors fabricated in the front-end-of-line (FEOL), which is not desirable. The high temperature annealing in the BEOL may cause leakage currents of the capacitive membrane of capacitors in the FEOL. Furthermore, increased hydrogen in and around the high-k material in the compensation capacitors may cause leakage currents in the compensation capacitors in the BEOL due to chemical reduction of the high-k material. Thus, structures or methods that provide hydrogen to the memory cells while suppressing excess hydrogen around the compensation capacitors in the BEOL are desired.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Embodiments of the present disclosure will be described with reference to FIG. 1 to FIG. 8. The following description uses a dynamic random-access memory (DRAM) as an illustrative example of a semiconductor memory device.

Figure 1:
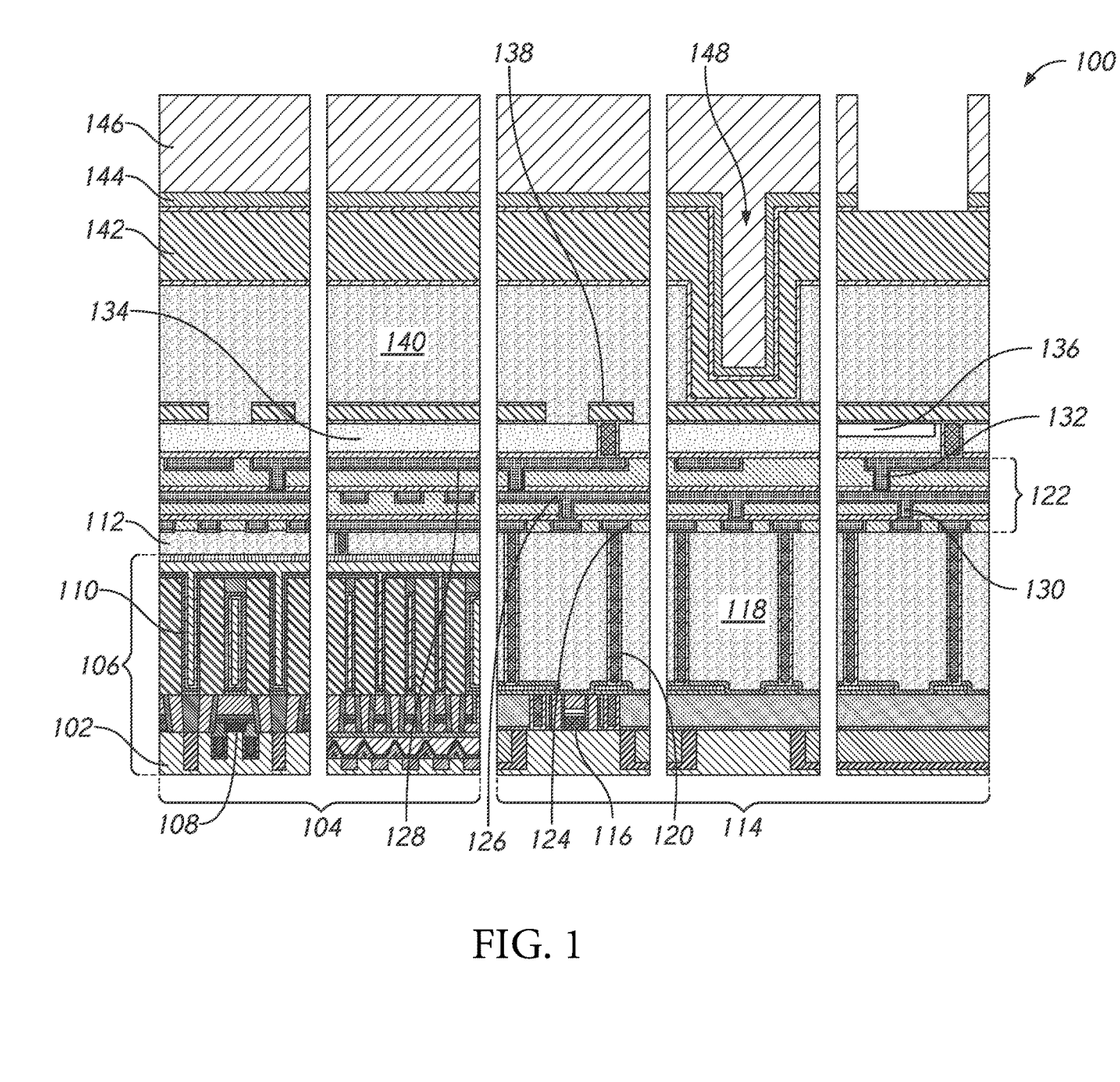
FIG. 1 is a vertical cross-sectional view of a structure of a semiconductor memory device including a memory cell region and a peripheral region in accordance with one embodiment of the present disclosure.

FIG. 1 is a vertical cross-sectional view of a structure of a memory device 100 including a memory cell region 104 and a peripheral region 114 in accordance with one embodiment of the present disclosure.

The memory device 100 may be an apparatus including a portion fabricated in a FBOL above a substrate 102. The portion fabricated in the FEOL includes a memory cell 106 in the memory cell region 104. The memory cell 106 may be disposed on a substrate 102. The memory cell 106 may include a transistor 108 on the substrate 102 and a capacitor 110 coupled to the transistor 108. An insulating film 112 may be disposed on the substrate 102, above the capacitor 110.

In the peripheral region 114, the portion fabricated in the FEOL includes a transistor 116 that may be disposed on the substrate 102. An insulating film 118 may be disposed above the substrate 102 in the peripheral region 114. The insulating film 118 may be disposed above the transistor 116. A via 120 coupled to the transistor 116 may be disposed within the insulating film 118. In some embodiments, the insulating films 112 and 118 may be continuous. In some embodiments, the insulating films 112 and 118 may include the same material, for example, silicon dioxide (SiO2).

The memory device 100 may include a portion fabricated in a BEOL above the portion fabricated in the FEOL. The portion fabricated in the BEOL includes a portion 122 including insulating films above the insulating films 112 and 118. The portion 122 may also include interconnects 124, 126 and 128 disposed above the insulating films 112 and 118. While the portion 122 in FIG. 1 includes the interconnects 124, 126 and 128, a number of interconnects may not be limited to three. In some embodiments, the interconnect 124 may be disposed on the insulating films 112 and 118. The interconnect 126 may be disposed on one or more insulating layers of the portion 122 that is on the interconnect 124. The interconnect 128 may be disposed on portion 122 that is on the interconnect 128. In some embodiments, there may be one or more interconnects 130 and 132 that couple the interconnects 124, 126 and 128 to one another. In some embodiments, the interconnects 130 and 132 may include the same material as the interconnects 124, 126 and 128. (n some embodiments, one or more insulating layers of the portion 122 may be disposed on the interconnect 128. In some embodiments, the interconnects 124, 126 and 128 may be conductive layers. In some embodiments, the interconnects 124, 126 and 128 may be a first metal layer (M1), a second metal layer (M2), and a third metal layer (M3) including metal, respectively. For example, the interconnects 124, 126 and 128 may include copper (Cu). In some embodiments, the portion 122 may include material having a lower dielectric constant (k) (low-k material) than silicon dioxide (SiO2) that exhibits weak electric polarization between conductive layers. The low-k material may be included to prevent diffusion of a conductive material, such as copper (Cu), and to reduce parasitic capacitance between the interconnects. Using the low-k material may help to achieve high speed operations of electronic circuits in the semiconductor devices. In some embodiment, the low-k material may include silicon oxycarbide (SiOC) or silicon carbonitride (SiCN). In some embodiments, the interconnects 124, 126, 128, 130 and 132 may include coating on surfaces in contact with the low-k material.

An insulating film 134 may be disposed on the portion 122. In some embodiments, the insulating film 134 may include silicon dioxide (SiO2). Within the insulating film 134, a capacitor 136 may be disposed. In some embodiments, the capacitor 136 may be a metal-insulator-metal (MIM) capacitor. Above the insulating film 134 and the capacitor 136, another interconnect 138 may be disposed. In some embodiments, the interconnect 138 may be a conductive layer. In some embodiments, the interconnect 138 may include metal. For example, the interconnect 138 may include aluminum (Al). In some embodiments, there may be another insulating film above or below the insulating film 134 and one or more interconnects above the other insulating film may be disposed in FIG. 1. The capacitor 136 may be coupled to the interconnect 138. Another insulating layer 140 may be disposed on the interconnect 138. The insulating film 140 may include silicon dioxide (SiO2). The insulating layer 140 may have an opening 148. A conductive layer 142 may be disposed above the insulating layer 140. The conductive layer 142 may have a portion covering the insulating film 140 along a side of the opening 148 and a portion that is a bottom of the opening 148 where a pad may be disposed to be coupled to the interconnect 138 In some embodiment, the conductive layer 142 may be an integrated redistribution layer. In some embodiments, the conductive layer 142 may include aluminum (Al). The conductive layer 142 may be covered by a passivation film 144. In some embodiments, the passivation film 144 may include silicon nitride (Si3N4). In some embodiments, a polyimide film 146 may be disposed above the passivation film 144. In some embodiments, the polyimide film 146 may include photopolymer material.

Figure 2:
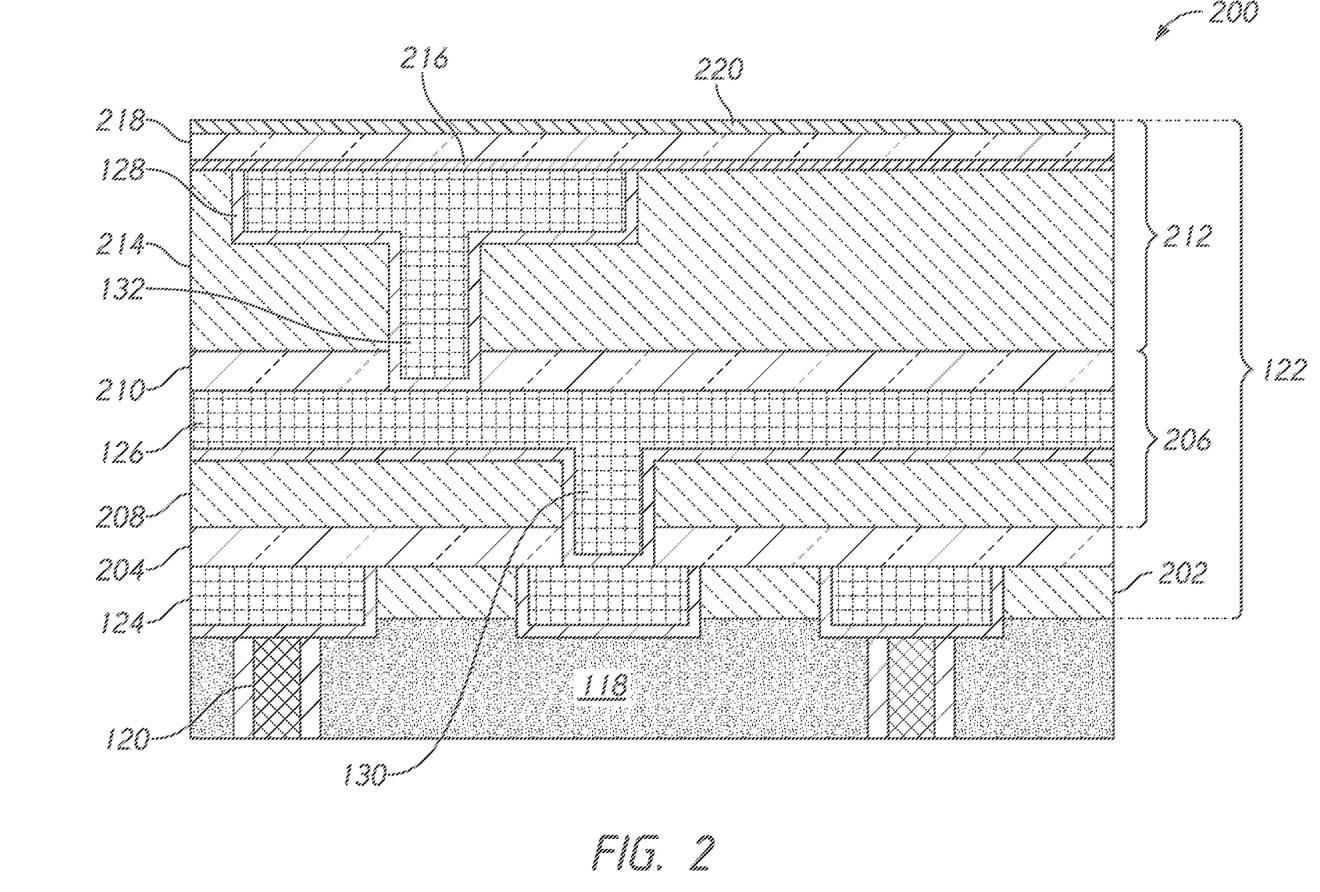
FIG. 2 is a vertical cross-sectional view of a structure of a portion of the memory device in accordance with one embodiment of the present disclosure.

FIG. 2 is a vertical cross-sectional view of a structure of a portion 200 of the memory device 100 in accordance with one embodiment of the present disclosure. In some embodiments, the portion 200 may include the via 120 in the insulating film 118 and the portion 122 of FIG. 1 above the insulating film 118 and the via 120. The portion 122 may include an insulating film 208, an interconnect 124 disposed in the insulating film 202, an insulating film 204 above the interconnect 124 and the insulating film 202, a portion 206 above the insulating film 204, and a portion 212 above the portion 206.

The portion 206 may include an insulating film 208, an interconnect 126 above the insulating film 208 and an insulating film 210 above the interconnect 126. The portion 206 may also include an interconnect 130 through the insulating films 204 and 208 that couples the interconnect 126 to the interconnect 124. The portion 212 may include an insulating film 214, an interconnect 128 above the insulating film 214, a hydrogen supply film 216 above the interconnect 128, an insulating film 218 above the hydrogen supply film 216, and a hydrogen barrier film 220 above the insulating film 218. The portion 212 may also include an interconnect 132 through the insulating films 210 and 214 that couples the interconnect 128 to the interconnect 126. In some embodiments, the insulating films 202, 204, 208, 210, 214 and 218 may include material that has a lower dielectric constant (k) (low-k material) than silicon dioxide (SiO2) that exhibits weak electric polarization between conductive materials. The insulating films 204, 210 and 218 may include so-called barrier low-k (BLOk) films to prevent diffusion of conductive material, such as copper (Cu). By including the BLOk films, parasitic capacitance between the interconnects may be reduced and high speed operations of electronic circuits in semiconductor devices may be achieved. The low-k material in the insulating films 202, 204, 208,210, 214 and 218 may include, for example, carbon-doped silicon oxide (SiOC) or nitrogen-doped silicon carbide (SiCN).

The hydrogen supply film 216 may release hydrogen and/or hydrogen ions during subsequent thermal processes. For example, the hydrogen supply film 216 may include a passivation plasma enhanced chemical vapor deposition (PECVD) silicon nitride (Si3N4) film that may release hydrogen and/or hydrogen ions during subsequent thermal processes at relatively lower temperatures, compared to temperatures for forming layers in the FEOL. For example, the passivation PECVD silicon nitride film may have at least one of higher concentration of Si—H bonds, a low concentration of N—H bonds, or a high Si/N composition. The released hydrogen and/or the hydrogen ions may reach the capacitor 110 and transistors 108 and 116 in FIG. 1. The hydrogen and/or hydrogen ions provided by the hydrogen supply film 216 may reduce leakage currents of the capacitor 110 and the transistors 108 and 116. Including the hydrogen supply film 216 may improve data reliability and refresh rates of the memory cell 106 in FIG. 1.

The hydrogen barrier film 220 may be disposed above the hydrogen supply film 216. The hydrogen barrier film 220 may be disposed between the hydrogen supply film 216 and the capacitor 136 (shown in FIG. 1). For example, the hydrogen barrier film 220 may block hydrogen and hydrogen ions and limit migration of the hydrogen and hydrogen ions from one side of the hydrogen barrier film 220 to the other. In some embodiments, the hydrogen barrier film 220 may be used to prevent hydrogen and hydrogen ions from migrating to other films and/or semiconductor structures. For example, preventing hydrogen and hydrogen ions from the hydrogen supply film 216 positioned below the hydrogen barrier film 220 migrating to films and/or structures positioned above the hydrogen barrier film 220. The hydrogen barrier film 220 may be hydrogen-impermeable, for example, include hydrogen-impermeable material that may not permeate hydrogen and hydrogen ions. The hydrogen barrier film 220 may include at least one of aluminum oxide (Al2O3), aluminum oxynitride (AlON) or silicon nitride (Si3N4) disposed by atomic layer deposition (ALD). In some embodiments, the hydrogen barrier film 220 may be formed around or under 400° C. Including the hydrogen barrier film 220 may prevent the hydrogen and hydrogen ions released from the hydrogen supply film 216 from reaching the capacitor 136 in FIG. 1.

Figure 3A:
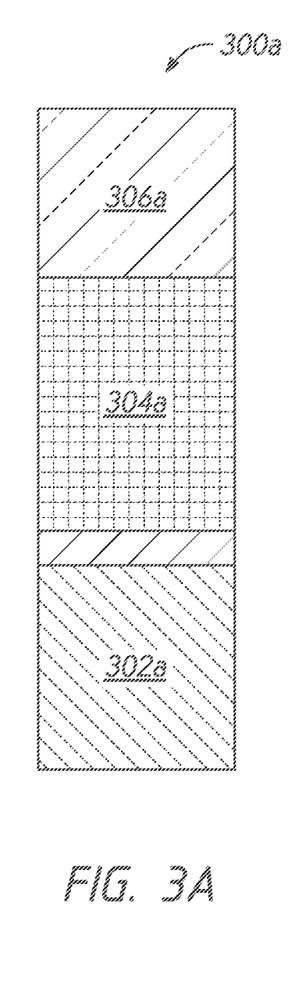
FIG. 3A is a vertical cross-sectional view of a structure of a portion of the memory device in accordance with one embodiment of the present disclosure.

FIG. 3A is a vertical cross-sectional view of a structure of a portion 300a of the memory device 100 in accordance with one embodiment of the present disclosure. In some embodiments, the portion 300a may be included in the portion 206. The portion 300a may include an insulating film 302a, an interconnect 304a above the insulating film 302a and an insulating film 306a above the interconnect 304a. The insulating films 302a and 306a may include low-k material. The low-k material in the insulating films 302a and 306a may include, for example, carbon-doped silicon oxide (SiOC) or nitrogen-doped silicon carbide (SiCN). The interconnect 304a may correspond to the interconnect 126 that may include copper (Cu). The insulating film 306a may include a BLOk film that may prevent diffusion of conductive material, such as copper (Cu) from the interconnect 304a.

Figures 3B, 3C:
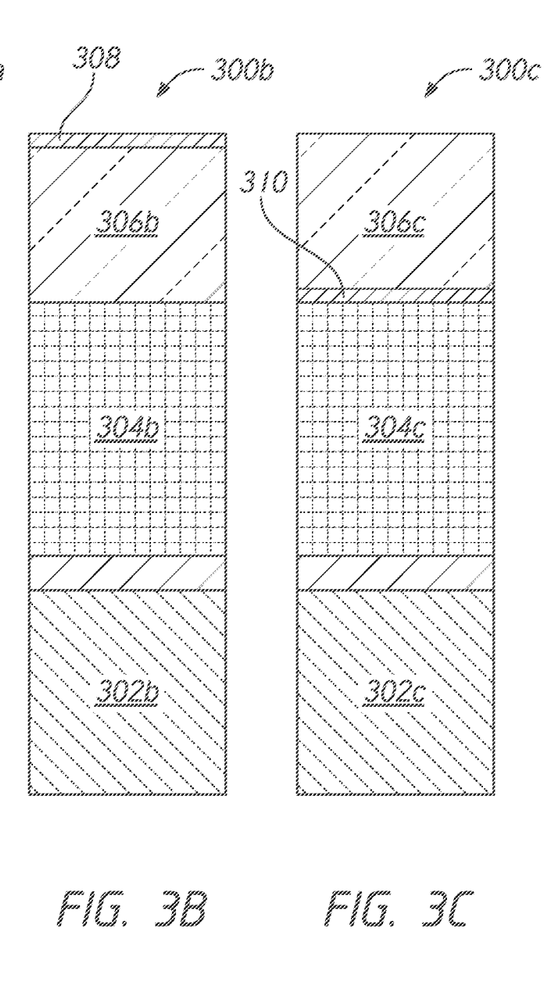
FIG. 3B is a vertical cross-sectional view of a structure of a portion of the memory device in accordance with one embodiment of the present disclosure.
FIG. 3C is a vertical cross-sectional view of a structure a portion of the memory in accordance with one embodiment of the present disclosure.

In some embodiments, the portion 206 of FIG. 2 may include a hydrogen supply film. FIG. 3B is a vertical cross-sectional view of a structure of a portion 300b of the memory device 100 in accordance with one embodiment of the present disclosure. In some embodiments, the portion 300b may be included in the portion 206. The portion 300b includes an insulating film 302b, an interconnect 304b above the insulating film 302b and an insulating film 306b above the interconnect 304b, which are similar to the insulating film 302a, the interconnect 304a and the insulating film 306a. Thus, a detailed description of the insulating film 302b, the interconnect 304b and the insulating film 306b is omitted in the interest of brevity. The portion 300b may include a hydrogen supply film 308 above the insulating film 306b. The hydrogen supply film 308 may release hydrogen and/or hydrogen ions during subsequent thermal processes to treat the transistors 108 and 116 and the capacitor 110 in FIG. 1.

FIG. 3O is a vertical cross-sectional view of a structure of a portion 300c of the memory device in accordance with one embodiment of the present disclosure. In some embodiments, the portion 300c may be included in the portion 206. The portion 300c includes an insulating film 302c, an interconnect 304c above the insulating film 302c and an insulating film 306c above the interconnect 304c, which are similar to the insulating film 302a, the interconnect 304a and the insulating film 306a. Thus, a detailed description of the insulating film 302c, the interconnect 304c and the insulating film 306c is omitted in the interest of brevity. The portion 300c may include a hydrogen supply film 310 disposed between the interconnect 304c and the insulating film 306c. The hydrogen supply film 310 may release hydrogen and/or hydrogen ions during subsequent thermal processes to treat the transistors 108 and 116 in FIG. 1.

Figure 3D:
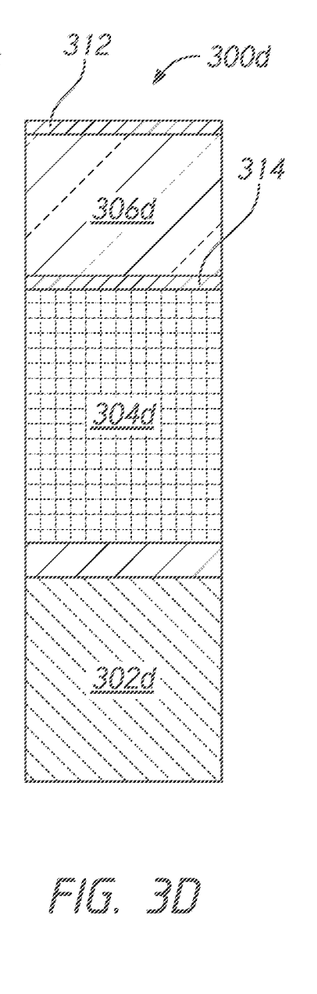
FIG. 3D is a vertical cross-sectional view of a structure of a portion of the memory device in accordance with one embodiment of the present disclosure.

FIG. 3D is a vertical cross-sectional view of a structure of a portion 300d of the memory device in accordance with one embodiment of the present disclosure. In some embodiments, the portion 300d may be included in the portion 206, The portion 300d includes an insulating film 302d, an interconnect 304d above the insulating film 302d and an insulating film 306d above the interconnect 304d, which are similar to the insulating film 302a, the interconnect 304a and the insulating film 306a. Thus, a detailed description of the insulating film 302d, the interconnect 304d and the insulating film 306d is omitted in the interest of brevity. The portion 300d may further include hydrogen supply films 312 and 314. The hydrogen supply film 312 may be disposed above the insulating film 306d. The hydrogen supply film 314 may be disposed between the interconnect 304d and the insulating film 306d. The hydrogen supply films 312 and 314 may release hydrogen and/or hydrogen ions during subsequent thermal processes to treat the transistors 108 and 116 in FIG. 1.

Figures 4A, 4B, 4C:
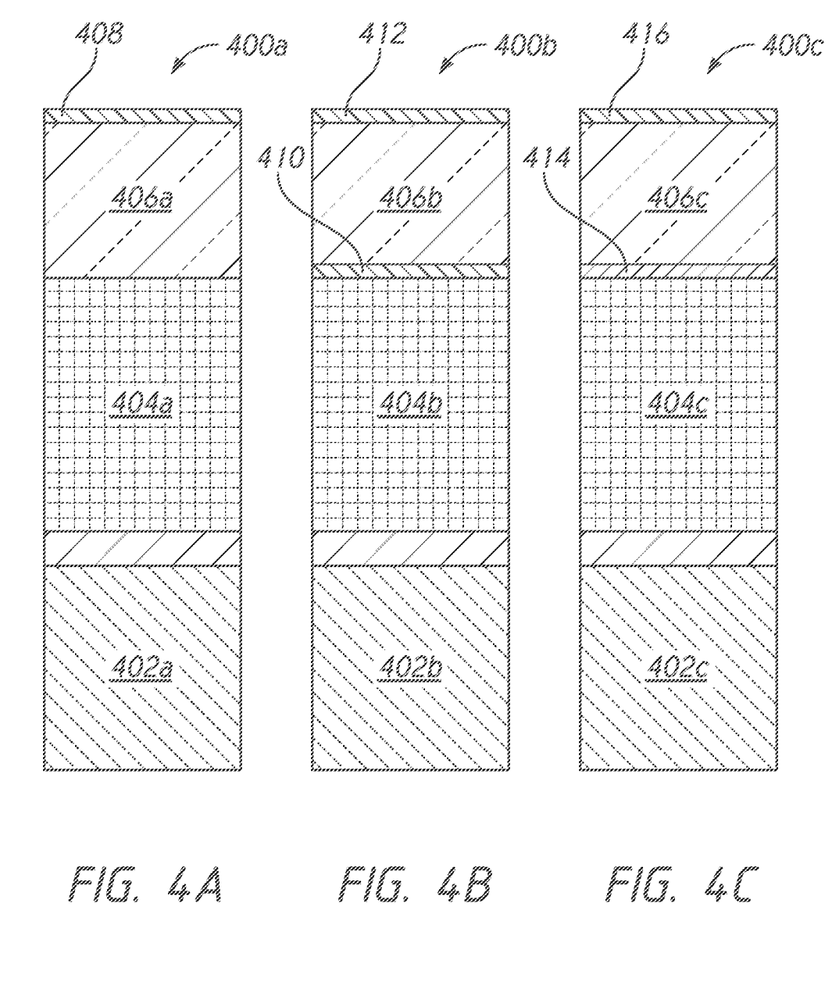
FIG. 4A is a vertical cross-sectional view of a structure of a portion of the memory device in accordance with one embodiment of the present disclosure.
FIG. 4B is a vertical cross-sectional view of a structure of a portion of the memory device in accordance with one embodiment of the present disclosure.
FIG. 4C is a vertical cross-sectional view of a structure of a portion of the memory device in accordance with one embodiment of the present disclosure.

In some embodiments, the portion 212 of FIG. 2 may include a hydrogen barrier film. FIG. 4A is a vertical cross-sectional view of a structure of a portion 400a of the memory device 100 in accordance with one embodiment of the present disclosure. In some embodiments, the portion 400a may be included in the portion 212. The portion 400a may include an insulating film 402a, an interconnect 404a above the insulating film 402a and an insulating film 406a above the interconnect 404a. The insulating films 402a and 406a may include low-k material. The low-k material in the insulating films 402a and 406a may include, for example, carbon-doped silicon oxide (SiOC) or nitrogen-doped silicon carbide (SiCN). The interconnect 404a may correspond to the interconnect 128 that may include copper (Cu). The insulating film 406a may include a BLOk film that may prevent diffusion of conductive material, such as copper (Cu), from the interconnect 404a.

The portion 400a may include a hydrogen barrier film 408 above the insulating film 406a. For example, the hydrogen barrier film 408 may block hydrogen and hydrogen ions and limit migration of the hydrogen and hydrogen ions from one side of the hydrogen barrier film 408 to the other. In some embodiments, the hydrogen barrier film 408 may be used to prevent hydrogen and hydrogen ions from migrating to other films and/or semiconductor structures. For example, preventing hydrogen and hydrogen ions from a hydrogen supply film positioned below the hydrogen barrier film 408 migrating to films and/or structures positioned above the hydrogen barrier film 408. The hydrogen barrier film 408 may be hydrogen-impermeable, for example, include hydrogen-impermeable material that may not permeate hydrogen and hydrogen ions. The portion 400a may be disposed above any one of the portions 300b, 300c, or 300d. The hydrogen barrier film 408 may prevent the hydrogen and hydrogen ions released from a hydrogen supply film, such as the hydrogen supply film 216 of the portion 212, the hydrogen supply film 308 of the portion 300b, the hydrogen supply film 310 of the portion 300c, or the hydrogen supply film 314 of the portion 300d, from reaching the capacitor 136 in FIG. 1. Because at least one hydrogen supply film may be included above the portion 300a, the portion 400a may not be disposed above the portion 300a. The hydrogen barrier film 408 may include at least one of aluminum oxide (Al2O3), aluminum oxynitride (AlON) or silicon nitride (Si3N4) deposited by ALD processes.

FIG. 4B is a vertical cross-sectional view of a structure of a portion 400b of the memory device 100 in accordance with one embodiment of the present disclosure. In some embodiments, the portion 400b may be included in the portion 212. The portion 400b may include an insulating film 402b, an interconnect 404b above the insulating film 402b and an insulating film 406b above the interconnect 404b. The insulating films 402b and 406b may include low-k material. For example, the low-k material in the insulating films 402b and 406b may include carbon-doped silicon oxide (SiOC) or nitrogen-doped silicon carbide (SiCN). The interconnect 404b may correspond to the interconnect 128 that may include copper (Cu). The insulating film 406b may include a BLOk film that may prevent diffusion of conductive material, such as copper (Cu), from the interconnect 404b.

The portion 400b may include a hydrogen barrier film 410 between the interconnect 404b and the insulating film 406b. The portion 400b may also include a hydrogen barrier film 412 above the insulating film 406b. For example, the hydrogen barrier films 410 and 412 may block hydrogen and hydrogen ions and limit migration of the hydrogen and hydrogen ions from one side of the hydrogen barrier films 410 and 412 to the other respectively. In some embodiments, the hydrogen barrier films 410 and 412 may be used to prevent hydrogen and hydrogen ions from migrating to other films and/or semiconductor structures. For example, preventing hydrogen and hydrogen ions from a hydrogen supply film positioned below the hydrogen barrier films 410 and 412 migrating to films and/or structures positioned above the hydrogen barrier films 410 and 412. The hydrogen barrier films 410 and 412 may be hydrogen-impermeable, for example, include hydrogen-impermeable material that may not permeate hydrogen and hydrogen ions. The portion 400b may be disposed above any one of the portions 300b, 300c, or 300d. The hydrogen barrier films 410 and 412 may prevent the hydrogen and hydrogen ions released from a hydrogen supply film, such as the hydrogen supply film 216 of the portion 212, the hydrogen supply film 308 of the portion 300b, the hydrogen supply film 310 of the portion 300c, or the hydrogen supply film 314 of the portion 300d, from reaching the capacitor 136 in FIG. 1. Because at least one hydrogen supply film may be included above the portion 300a, the portion 400b may not be disposed above the portion 300a. The hydrogen barrier films 410 and 412 may include at least one of aluminum oxide (Al2O3), aluminum oxynitride (AlON) or silicon nitride (Si3N4) deposited by ALD processes.

FIG. 4O is a vertical cross-sectional view of a structure of a portion 400c of the memory device 100 in accordance with one embodiment of the present disclosure. In some embodiments, the portion 400c may be included in the portion 212. The portion 400c may include an insulating film 402c, an interconnect 404c above the insulating film 402c and an insulating film 406c above the interconnect 404c. The insulating films 402c and 406c may include low-k material. For example, the low-k material in the insulating films 402c and 406c may include carbon-doped silicon oxide (SiOC) or nitrogen-doped silicon carbide (SiCN). The interconnect 404c may correspond to the interconnect 128 that may include copper (Cu). The insulating film 406c may include a BLOk film that may prevent diffusion of conductive material, such as copper (Cu), from the interconnect 404c.

The portion 400c may include a hydrogen supply film 414 between the interconnect 404c and the insulating film 406c. The hydrogen supply film 414 may release hydrogen and/or hydrogen ions during subsequent thermal processes to treat the transistors 108 and 116 in FIG. 1. The portion 400c may also include a hydrogen barrier film 416 above the insulating film 406b. For example, the hydrogen barrier film 416 may block hydrogen and hydrogen ions and limit migration of the hydrogen and hydrogen ions from one side of the hydrogen barrier film 416 to the other. In some embodiments, the hydrogen barrier film 416 may be used to prevent hydrogen and hydrogen ions from migrating to other films and/or semiconductor structures. For example, preventing hydrogen and hydrogen ions from a hydrogen supply film positioned below the hydrogen barrier film 416 migrating to films and/or structures positioned above the hydrogen barrier film 416. The hydrogen barrier film 416 may be hydrogen-impermeable, for example, include hydrogen-impermeable material that may not permeate hydrogen and hydrogen ions. The portion 400c may be disposed above any one of the portions 300a, 300b, 300c, or 300d. The hydrogen barrier film 416 may prevent the hydrogen and hydrogen ions released from the hydrogen supply film 414 as well as the hydrogen supply film 216 of the portion 212, the hydrogen supply film 308 of the portion 300b, the hydrogen supply film 310 of the portion 300c, or the hydrogen supply film 314 of the portion 300d, from reaching the capacitor 136 in FIG. 1. The hydrogen barrier film 416 may include at least one of aluminum oxide (Al2O3), aluminum oxynitride (AlON) or silicon nitride (Si3N4) deposited by ALD processes.

Figure 4D:
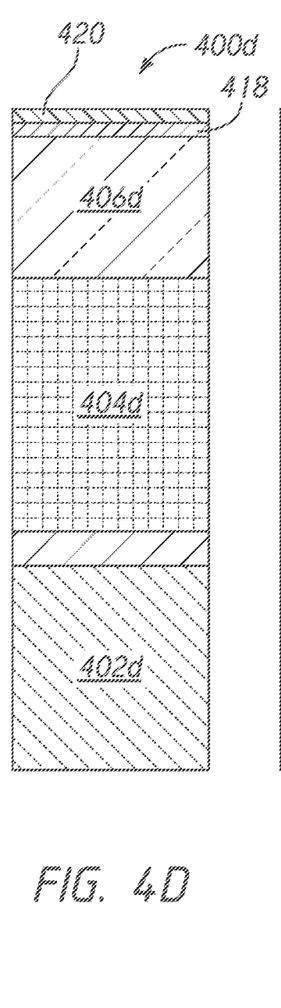
FIG. 4D is a vertical cross-sectional view of a structure of a portion of the memory device in accordance with one embodiment of the present disclosure.

FIG. 4D is a vertical cross-sectional view of a structure of a portion 400d of the memory device 100 in accordance with one embodiment of the present disclosure. In some embodiments, the portion 400d may be included in the portion 212. The portion 400d may include an insulating film 402d, an interconnect 404d above the insulating film 402d and an insulating film 406d above the interconnect 404d. The insulating films 402d and 406d may include low-k material. For example, the low-k material in the insulating films 402d and 406d may include carbon-doped silicon oxide (SiOC) or nitrogen-doped silicon carbide (SiCN). The interconnect 404d may correspond to the interconnect 128 that may include copper (Cu). The insulating film 406d may include a BLOk film that may prevent diffusion of conductive material, such as copper (Cu), from the interconnect 404d.

The portion 400d may include a hydrogen supply film 418 above the insulating film 406c. The hydrogen supply film 418 may release hydrogen and/or hydrogen ions during subsequent thermal processes to treat the transistors 108 and 116 in FIG. 1. The portion 400d may also include a hydrogen barrier film 420 above the hydrogen supply film 418. For example, the hydrogen barrier film 420 may block hydrogen and hydrogen ions and limit migration of the hydrogen and hydrogen ions from one side of the hydrogen barrier film 420 to the other. In some embodiments, the hydrogen barrier film 420 may be used to prevent hydrogen and hydrogen ions from migrating to other films and/or semiconductor structures. For example, preventing hydrogen and hydrogen ions from the hydrogen supply film 418 positioned below the hydrogen barrier film 420 migrating to films and/or structures positioned above the hydrogen barrier film 420. The hydrogen barrier film 420 may be hydrogen-impermeable, for example, include hydrogen-impermeable material that may not permeate hydrogen and hydrogen ions. The portion 400d may be disposed above any one of the portions 300a, 300b, 300c, or 300d. The hydrogen barrier film 420 may prevent the hydrogen and hydrogen ions released from the hydrogen supply film 418 as well as the hydrogen supply film 216 of the portion 212, the hydrogen supply film 308 of the portion 300b, the hydrogen supply film 310 of the portion 300c, or the hydrogen supply film 314 of the portion 300d, from reaching the capacitor 136 in FIG. 1. The hydrogen barrier film 420 may include at least one of aluminum oxide (Al2O3), aluminum oxynitride (AlON) or silicon nitride (Si3N4) deposited by ALD processes.

Figure 4E:
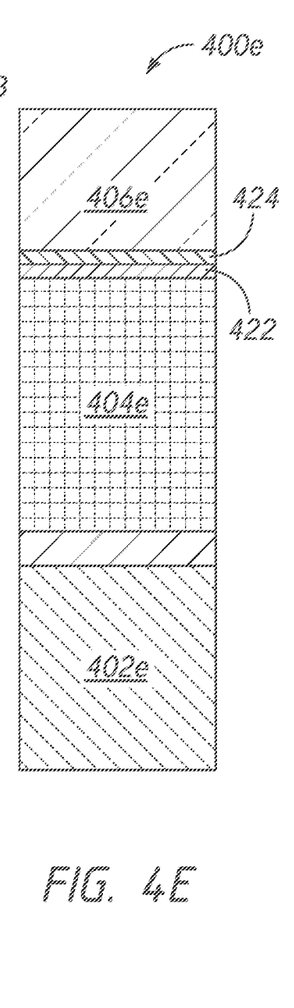
FIG. 4E is a vertical cross-sectional view of a structure of a portion of the memory device in accordance with one embodiment of the present disclosure.

FIG. 4E is a vertical cross-sectional view of a structure of a portion 400e of the memory device 100 in accordance with one embodiment of the present disclosure. In some embodiments, the portion 400e may be included in the portion 212. The portion 400c may include an insulating film 402c, an interconnect 404e above the insulating film 402e and an insulating film 406e above the interconnect 404e. The insulating films 402e and 406e may include low-k material. For example, the low-k material in the insulating films 402e and 406e may include carbon-doped silicon oxide (SiOC) or nitrogen-doped silicon carbide (SiCN). The interconnect 404c may correspond to the interconnect 128 that may include copper (Cu). The insulating film 406c may include a BLOk film that may prevent diffusion of conductive material, such as copper (Cu), from the interconnect 404e.

The portion 400e may include a hydrogen supply film 422 above the interconnect 404e. The hydrogen supply film 422 may release hydrogen and/or hydrogen ions during subsequent thermal processes to treat the transistors 108 and 116 in FIG. 1. The portion 400c may also include a hydrogen barrier film 424 between the hydrogen supply film 422 and the insulating film 406e. For example, the hydrogen barrier film 424 may block hydrogen and hydrogen ions and limit migration of the hydrogen and hydrogen ions from one side of the hydrogen barrier film 424 to the other. In some embodiments, the hydrogen barrier film 424 may be used to prevent, hydrogen and hydrogen ions from migrating to other films and/or semiconductor structures. For example, preventing hydrogen and hydrogen ions from the hydrogen supply film 422 positioned below the hydrogen barrier film 424 migrating to films and/or structures positioned above the hydrogen barrier film 424. The hydrogen barrier film 424 may be hydrogen-impermeable, for example, include hydrogen-impermeable material that may not permeate hydrogen and hydrogen ions. The portion 400e may be disposed above any one of the portions 300a, 300b, 300c, or 300d. The hydrogen barrier film 424 may prevent the hydrogen and hydrogen ions released from the hydrogen supply film 422 as well as the hydrogen supply film 216 of the portion 212, the hydrogen supply film 308 of the portion 300b, the hydrogen supply film 310 of the portion 300c, or the hydrogen supply film 314 of the portion 300d, from reaching the capacitor 136 in FIG. 1. The hydrogen barrier film 424 may include at least one of aluminum oxide (Al2O3), aluminum oxynitride (AlON) or silicon nitride (Si3N4) deposited by ALD processes.

Figure 5:
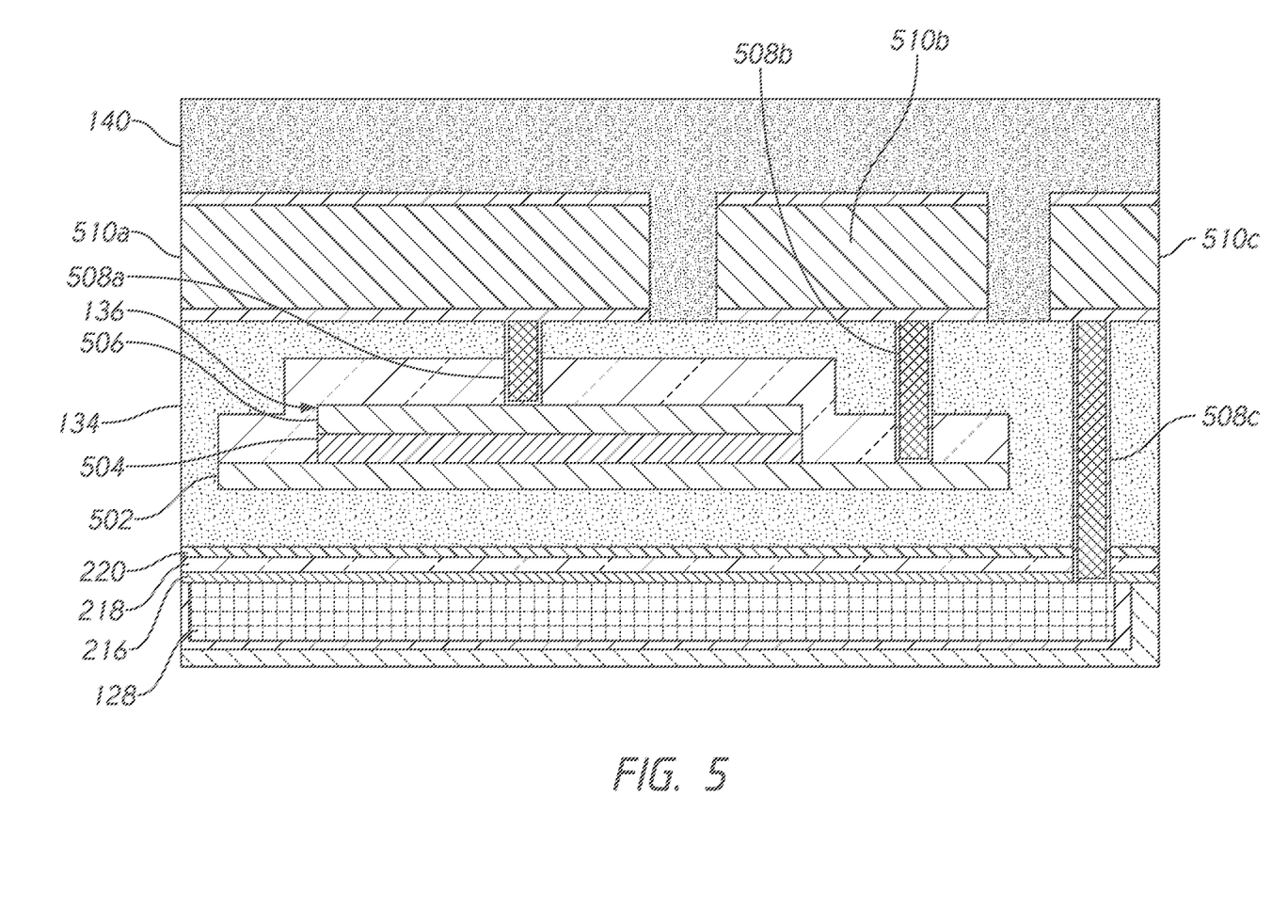
FIG. 5 is a vertical cross-sectional view of a structure of a capacitor of the memory device in accordance with one embodiment of the present disclosure.

FIG. 5 is a vertical cross-sectional view of a structure of the capacitor 136 of the memory device 100 in accordance with one embodiment of the present disclosure. In some embodiments, the capacitor 136 may be disposed in the insulating film 134 above the hydrogen barrier film 220. The capacitor 136 may include electrodes 502 and 506. The capacitor 136 may also include an insulating film 504 between the electrodes 502 and 506. The electrode 506 may be coupled to an interconnect 510a through an electrode 508a. The electrode 502 may be coupled to an interconnect 510b through an electrode 508b. There may be another electrode 508c through the insulating film 134 to couple the interconnect 128 to an interconnect 510c. In some embodiments, the interconnects 510a, 510b and 510c may be formed as interconnects 138 in one layer. In some embodiments, the interconnects 510a, 510b and 510c may include aluminum (Al).

In some embodiments, the capacitor 136 may be a metal-in-metal capacitor. The insulating film 504 may include material with high relative permittivity that has a greater dielectric constant (k) (high-k material) than silicon dioxide (SiO2). For example, the insulating film 504 may include, oxidized material containing transition metal and the like. For example, the transition metal may be any one of, for example, yttrium (Y), titanium (Ti), zirconium (Zr), hafnium (Hf), niobium (Nb), or tantalum (Ta). The hydrogen barrier film 220 may prevent hydrogen and/or hydrogen ions from the hydrogen supply film 216 through the insulating film 218 to reach the insulating film 504 of the capacitor 136. Thus, chemical reduction of the high-k material in the insulating film 504 may be prevented and leakage currents around the capacitor 136 may be controlled.

Figure 6:
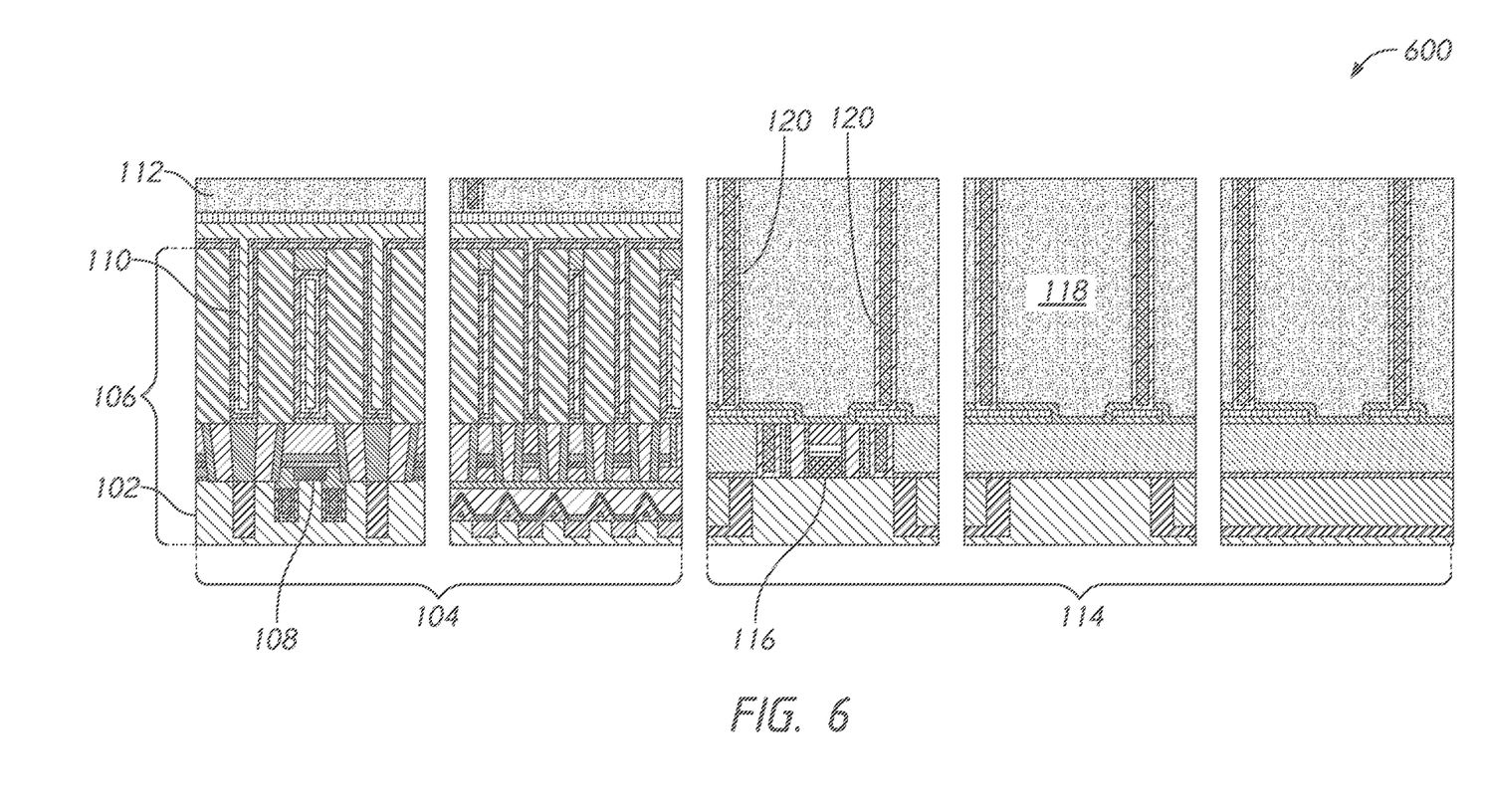
FIG. 6 is a vertical cross-sectional view of a structure of a portion of the memory device in accordance with one embodiment of the present disclosure.

FIG. 6 is a vertical cross-sectional view of a structure of a portion 600 of the memory device 100 in accordance with one embodiment of the present disclosure. In some embodiments, the portion 600 may be fabricated in the FEOL of the memory device 100. In the memory cell region 104, the memory cell 106 including the transistor 108 and the capacitor 110 may be disposed on the substrate 102. In some embodiments, the capacitor 110 may be an MIM capacitor. In some embodiments, the capacitor 110 may be formed at around 500° C. Above the capacitor 110, the insulating film 112 may be formed. In the memory cell peripheral region 114, the transistor 116 may be formed. Above the transistor 116, the insulating film 118 may be formed. In some embodiments, the insulating films 112 and 118 may be formed in a same process, (n some embodiments, the insulating films 112 and 118 may include silicon dioxide (SiO2). The vias 120 that couple the transistor 116 to interconnects disposed in the insulating film 118 fabricated in the BEOL.

Figure 7A:
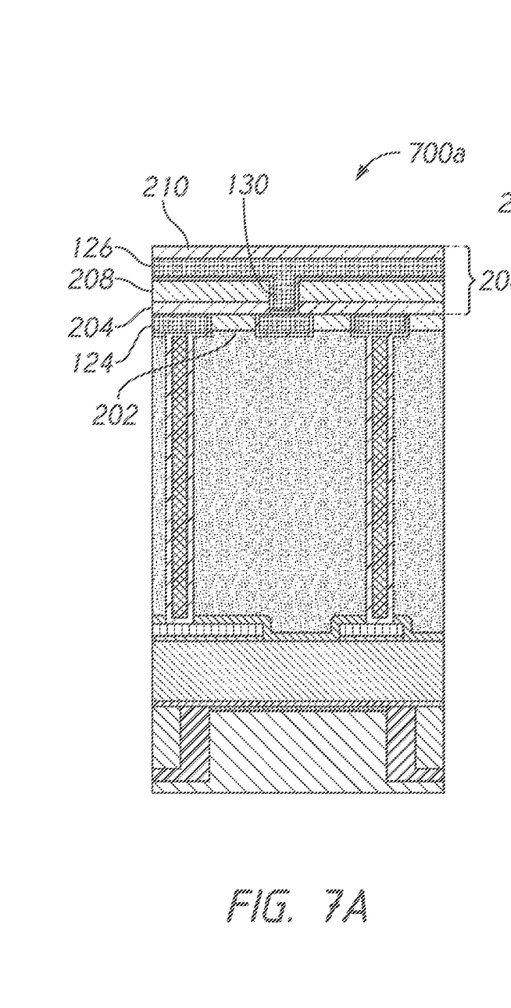
FIG. 7A is a vertical cross-sectional view of a structure of a portion of the memory device in accordance with one embodiment of the present disclosure.

FIG. 7A is a vertical cross-sectional view of a structure of a portion 70a of the memory device 100 in accordance with one embodiment of the present disclosure. In some embodiments, in the BEOL, the insulating film 202 may be formed above the portion 600. The insulating film 202 may be a capping layer. The insulating film 202 may include a low-k material, such as silicon oxycarbide (SiOC) or silicon carbonitride (SiCN), for example. The insulating film 202 may further include tetraethyl orthosilicate oxide (TEOS, Si(OC2H5)4). The interconnect 124 may be formed in the insulating film 202. For example, forming the interconnect may be performed by a single-Damascene process. The insulating film 202 may be patterned with open trenches using photopatterning and dry-etching. A barrier layer and a seed layer of conductive material (e.g., copper (Cu)) may be deposited by a physical vapor deposition (PVD) method, such as sputtering. By electroplating, conductive material may be formed. After forming the conductive material, excess conductive material and the TEOS in the insulating film 202 may be removed by planarization, such as chemical-mechanical polishing (CMP) to form the interconnect 124. The insulating film 204 may be formed above the interconnect 124. The insulating film 204 may include a BLOk film that may prevent diffusion of conductive material, such as copper (Cu) from the interconnect 124. In some embodiments, the insulating film 204 may be formed by a chemical vapor deposition (CVD) method.

The portion 206 may be formed above the insulating film 204. The insulating film 208 of the portion 206 may include a low-k material, such as silicon oxycarbide (SiOC) or silicon carbonitride (SiCN), for example. The insulating film 208 may further include tetraethyl orthosilicate oxide (TEOS, $Si(OC_2H_5)_4$). The interconnect 126 may be formed in or above the insulating film 208 and the interconnect 130 may be formed in the insulating film 208 to couple the interconnect 126 to the interconnect 124. In some embodiments, forming the interconnects 126 and 130 may be performed by a dual-Damascene process. The insulating film 208 may be patterned with open trenches using photopatterning and dry-etching. A barrier layer and a seed layer of conductive material (e.g., copper (Cu)) may be deposited by the PVD method, such as sputtering. Conductive material may be formed by electroplating. After forming the conductive material, excess conductive material and the TEOS in the insulating film 208 may be removed by planarization, such as chemical-mechanical polishing (CMP) to form the interconnects 126 and 130. The insulating film 210 may be formed above the interconnect 126. The insulating film 210 may include a BLOk film that may prevent diffusion of conductive material, such as copper (Cu) from the interconnect 126. In some embodiments, the insulating film 210 may be formed by the CVD method.

In some embodiments, as shown in FIG. 3B FIG. 3D, a hydrogen supply film may be formed in the portion 206. The hydrogen supply film may include a passivation plasma enhanced chemical vapor deposition (PECVD) silicon nitride (Si3N4) film that may be formed at a relatively low temperature (e.g., around 400° C.) compared to temperatures that layers in the FEOL is formed.

Figure 7B:
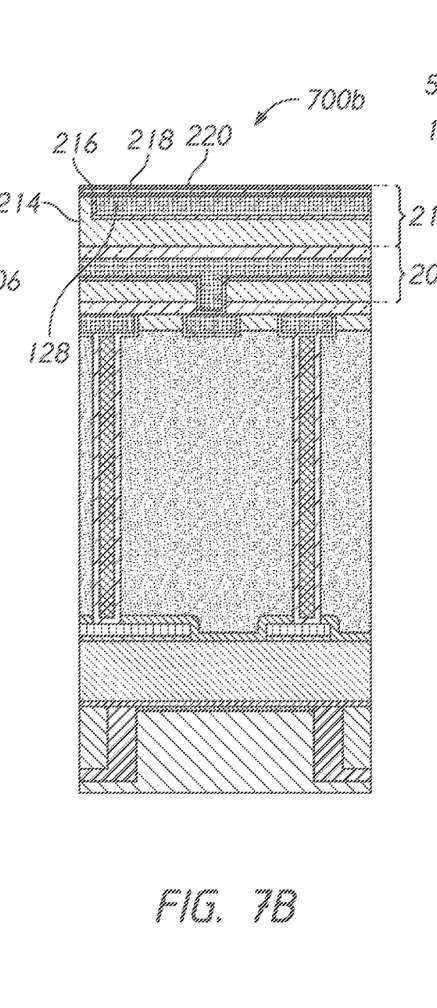
FIG. 7B is a vertical cross-sectional view of a structure of a portion of the memory device in accordance with one embodiment of the present disclosure.

FIG. 7B is a vertical cross-sectional view of a structure of a portion 700b of the memory device 100 in accordance with one embodiment of the present disclosure. The portion 700b includes the portion 212 formed above the portion 206. The insulating film 214 may include a low-k material, such as silicon oxycarbide (SiOC) or silicon carbonitride (SiCN), for example. The insulating film 214 may further include tetraethyl orthosilicate oxide (TEOS, $Si(OC_2H_5)_4$). The interconnect 128 may be formed in or above the insulating film 214 In some embodiments, forming the interconnect 128 may be performed by a dual-Damascene process. The insulating film 214 may be patterned with open trenches using photopatterning and dry-etching. A barrier layer and a seed layer of conductive material (e.g., copper (Cu)) may be deposited by the PVD method, such as sputtering. By electroplating, conductive material may be formed. After forming the conductive material, excess conductive material and the TEOS in the insulating film 214 may be removed by planarization, such as chemical-mechanical polishing (CMP) to form the interconnect 128. The insulating film 218 may be formed above the interconnect 128. The insulating film 218 may include a BLOk film that may prevent diffusion of conductive material, such as copper (Cu) from the interconnect 128. In some embodiments, the insulating film 218 may be formed by the CVD method.

In some embodiments, as shown in FIG. 4C-FIG. 4E, a hydrogen supply film 216 may be formed in the portion 212. The hydrogen supply film may include a passivation plasma enhanced chemical vapor deposition (PECVD) silicon nitride ($Si_3N_4$) film that may be formed at a relatively low temperature (e.g., around 400° C.) compared to temperatures that layers are formed in the FEOL. In some embodiments, as shown in FIG. 4A-FIG. 4E, one or more hydrogen barrier films 220 may be formed in the portion 212. The one or more hydrogen barrier films may be formed above one or more hydrogen supply films in the portions 206 and 212. The one or more hydrogen barrier films 220 may include at least one of aluminum oxide (Al2O3), aluminum oxynitride (AlON) or silicon nitride (Si3N4) formed by ALD or the PVD that may use temperatures lower than the temperature used in the FEOL.

Figure 7C:
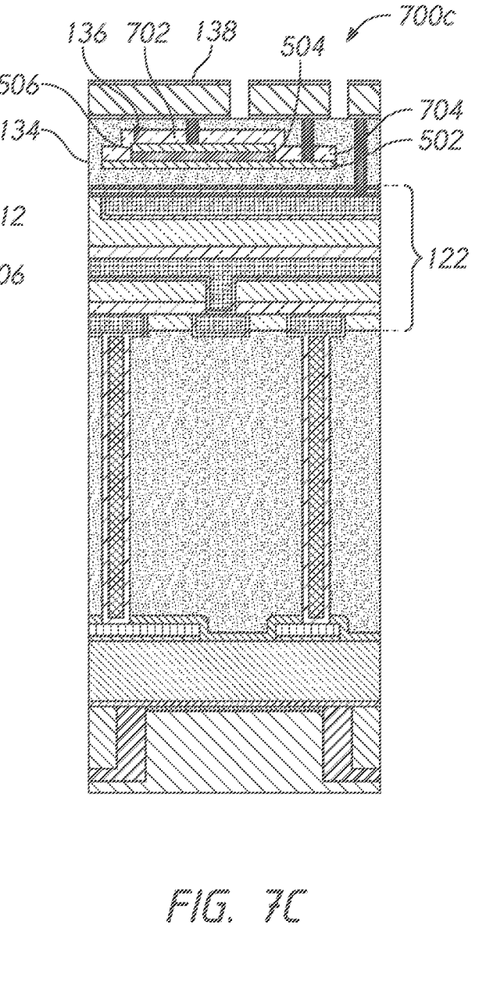
FIG. 7C is a vertical cross-sectional view of a structure of a portion of the memory device in accordance with one embodiment of the present disclosure.

FIG. 7C is a vertical cross-sectional view of a structure of a portion 700c of the memory device 100 in accordance with one embodiment of the present disclosure. The portion 700c includes the insulating film 134 above the portion 122. In some embodiments, the insulating film 134 may include silicon dioxide (SiO2) formed by the CVD. The portion 700c may include the capacitor 136 above the portion 122, disposed in or above the insulating film 134. In some embodiments, the capacitor 136 is an MIM capacitor including the electrodes 502 and 504 and the insulating film 504. The insulating film 504 may include high-k material. In some embodiments, the high-k material is oxidized transition metal and the like. For example, the transition metal may be any one of, for example, yttrium (Y), titanium (Ti), zirconium (Zr), hafnium (Hf), niobium (Nb), or tantalum (Ta). The electrode 502 may be formed by the CVD or the PVD on a lower portion of the insulating film 134. The insulating film 504 may be formed above the electrode 502 by the CVD or the PVD. The electrode 506 may be formed above the insulating film 504. After forming the electrodes 502 and 506 and the insulating film 504 between the electrode 502 and 506, the insulating film 504 and the electrode 506 above the insulating film 504 may be patterned with open trenches using photopatterning and dry-etching, and an insulating film 702, such as a barrier low-k (BLOk) film to prevent diffusion of conductive material, such as copper (Cu) may be formed. Further, the insulating films 504 and 702 may be patterned with open trenches using photopatterning and dry-etching, and an insulating film 704, such as a barrier low-k (BLOk) film may be formed. Thus, the capacitor 136 may be formed. An upper portion of the insulating film 134 above the capacitor 136 may be formed and planarization, such as chemical-mechanical polishing (CMP), may be performed. The electrodes 508a, 508b and 508c of FIG. 5 may be formed in the insulating film 134. For example, openings in the insulating film 134 using photopatterning and dry-etching are provided and a barrier film, such as titanium nitride (TiN), is provided inside the openings with the PVD. After depositing conductive material, such as tungsten (W) with the CVD, excess conductive material, such as the titanium nitride (TiN) and tungsten (W) may be removed by planarization, such as chemical-mechanical polishing (CMP) to form the electrodes 508a, 508b and 508c. The interconnect 138 including the interconnects 510a, 510b and 510c of FIG. 5 may be formed as one layer. In some embodiments, the interconnect 138 may include aluminum (Al). Using the PVD, a titanium nitride film, an aluminum film above the titanium nitride film and another titanium nitride film above may be formed, and the formed films are patterned with open trenches using photopatterning and dry-etching. A thermal process at around 400° C. (e.g., 350~450° C.) may be performed. During the thermal process, such as annealing, hydrogen bonds (e.g., Si—H bonds, N—H bonds) in the one or more hydrogen supply films in the portions 206 and 212 may be disconnected and hydrogen may be released. The hydrogen and/or the hydrogen ions may reach around the transistors 108 and 116 in FIG. 1, and prevent leakage currents of the transistors 108 and 116. Thus, data reliability and refresh rates of memory device 100 in FIG. 1 may be improved.

Figure 8:
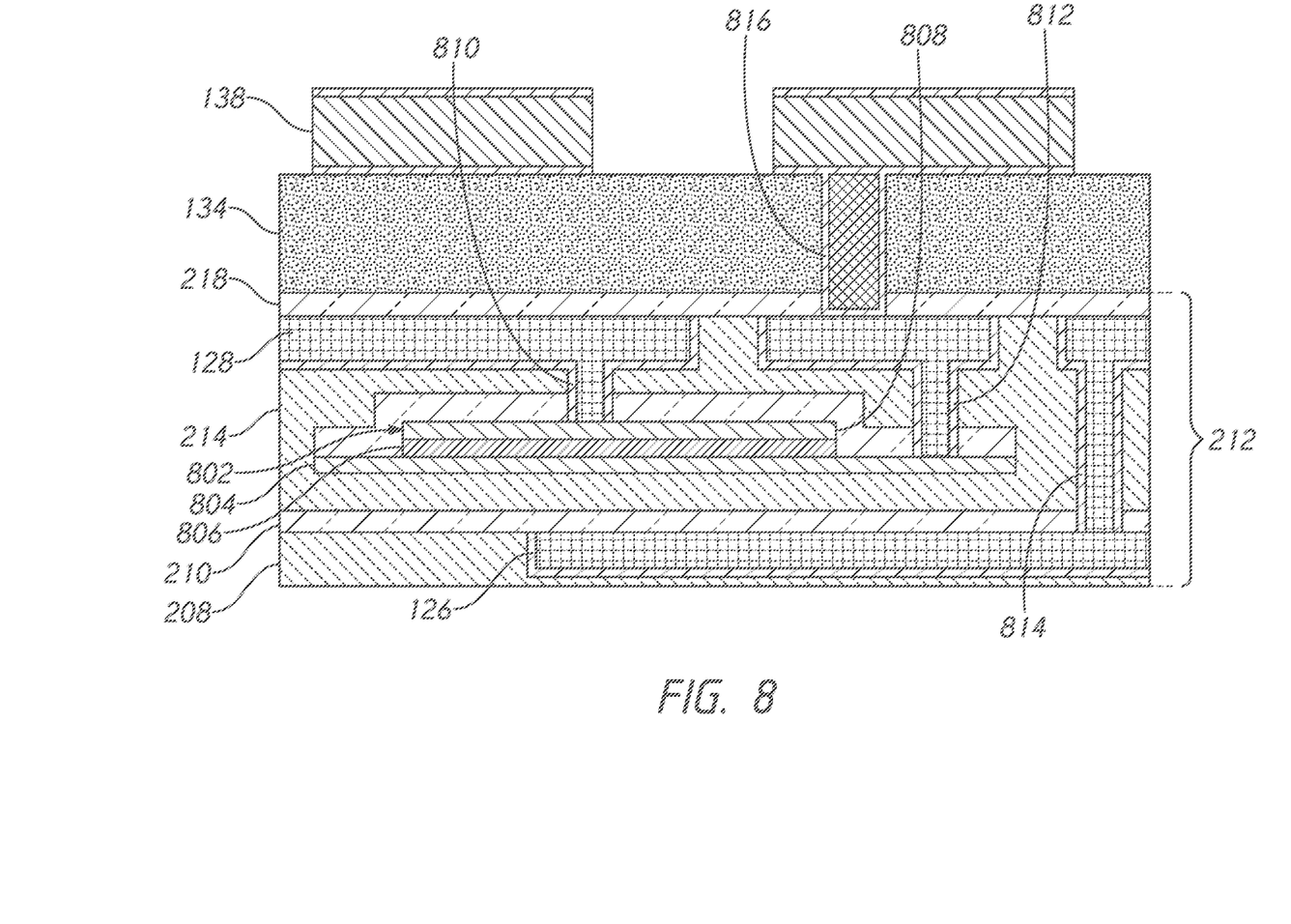
FIG. 8 is a vertical cross-sectional view of a structure of a capacitor of the memory device in accordance with one embodiment of the present disclosure.

In some embodiments, a capacitor may be fabricated in the portion 212. FIG. 8 is a vertical cross-sectional view of a structure of a capacitor 802 of the memory device 100 in accordance with one embodiment of the present disclosure. In some embodiments, the capacitor 802 may be disposed in the insulating film 214. One or more hydrogen barrier films (not shown) may be included below the capacitor 802 in the portion 206, such as above or below the insulating film 210. One or more hydrogen supply films (not shown) may be included below the one or more hydrogen barrier films in the portion 206.

The capacitor 802 may include electrodes 804 and 808. The capacitor 802 may also include an insulating film 806 between the electrodes 804 and 808. The electrode 804 may be coupled to one of the interconnects 128 through an interconnect 812. The electrode 808 may be coupled to one of the interconnects 128 through an interconnect 810. There may be another interconnect 814 through the insulating film 214 to couple the interconnect 126 to one of the interconnects 128. In some embodiments, the interconnects 128, 810, 812 and 814 may be formed by the dual-Damascene process. In some embodiments, the interconnects 128, 810, 812 and 814 may include copper (Cu). After forming interconnects 128, 810, 812 and 814, excess conductive material and the TEOS in the insulating film 214 may be removed by planarization, such as chemical-mechanical polishing (CMP) to form the interconnect 128. The insulating film 218 may be formed above the interconnect 128. The insulating film 218 may include a BLOk film that may prevent diffusion of conductive material, such as copper (Cu) from the interconnect 128. In some embodiments, the insulating film 218 may be formed by the CVD method. The insulating film 134 may be disposed above the portion 212. In some embodiments, the insulating film 134 may include silicon dioxide (SiO2) formed by the CVD. An electrode 816 may be formed in the insulating film 134, similarly to forming the electrodes 508a, 508b and 508c applying a barrier film such as titanium nitride (TiN) and filling conductive material, such as tungsten (W) with the CVD followed by planarization, such as chemical-mechanical polishing (CMP). The interconnect 138 may be formed above the electrode 816 that couples the interconnect 138 to the interconnect 128. In some embodiments, the interconnect 138 may include aluminum (Al). A thermal process at around 400° C. (e.g., 350–450° C.) may be performed. During the thermal process, such as annealing, hydrogen bonds (e.g., Si—H bonds, N—H bonds) in the one or more hydrogen supply films in the portions 206 and 212 may be disconnected and hydrogen may be released. The hydrogen and/or the hydrogen ions may reach around the transistors 108 and 116 in FIG. 1, and prevent leakage currents of the transistors 108 and 116. Thus, data reliability and refresh rates of memory device 100 in FIG. 1 may be improved.

By providing a hydrogen supply film closer to a memory element, hydrogen and/or the hydrogen ions produced by the hydrogen supply film may reach around the memory element, and prevent leakage currents of around the memory element. Thus, data reliability and refresh rates of the memory element may be improved. At the same time, by providing a hydrogen barrier film between the hydrogen supply film and a capacitor including a high-k material, the capacitor's leakage currents due to chemical reduction of the high-k material may be prevented.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus, comprising:
a first capacitor disposed above a substrate in a front-end-of-line (FEOL) in a memory cell region, the first capacitor being a metal-insulator-metal (MIM) memory cell capacitor;
a second capacitor in or above a back-end-of line (BEOL) in a peripheral region, the second capacitor being a MIM compensation capacitor;
a hydrogen supply film in the BEOL and above the first capacitor, the hydrogen supply film configured to provide at least one of hydrogen and hydrogen ions; and
a hydrogen barrier film in the BEOL and above the hydrogen supply film, the hydrogen barrier film configured to be hydrogen-impermeable between the hydrogen supply film and the second capacitor and prevent the hydrogen and/or hydrogen ions from reaching the second capacitor.

2. An apparatus, comprising:
a memory cell region including a metal-insulator-metal (MIM) memory cell capacitor in a front-end-of-line (FEOL);
a peripheral region including a MIM compensation capacitor in or above a back-end-of line (BEOL);
a hydrogen supply film in the BEOL and above the MIM memory cell capacitor, wherein the hydrogen supply film is in the memory cell region and peripheral region and configured to provide at least one of hydrogen and hydrogen ions; and
a hydrogen barrier film in the BEOL and above the hydrogen supply film, wherein the hydrogen barrier film is at least in the peripheral region and configured to block the at least one of hydrogen and hydrogen ions from one side to another side of the hydrogen barrier film.

3. The apparatus of claim 2 wherein the hydrogen barrier film includes at least one of at least one of aluminum oxide (Al2O3), aluminum oxynitride (AlON) or silicon nitride (Si3N4) disposed by atomic layer deposition (ALD).

4. The apparatus of claim 2, wherein the hydrogen supply film comprises at least one of higher concentration of Si—H bonds, a low concentration of N—H bonds, or a high Si/N composition.

5. The apparatus of claim 4, wherein the hydrogen supply film includes a passivation plasma enhanced chemical vapor deposition (PECVD) nitride film.

6. The apparatus of claim 2 wherein the MIM compensation capacitor comprises a film comprising a material that has a dielectric constant greater than a dielectric constant of silicon dioxide.

7. The apparatus of claim 6, wherein the film comprises oxidized transition metal, and wherein the transition metal may be any one of yttrium (Y), titanium (Ti), zirconium (Zr), hafnium (Hf), niobium (Nb), or tantalum (Ta).

8. The apparatus of claim 1, further comprising:
at least one interconnect including conductive material; and
an insulating film above the at least one interconnect, the insulating film configured to prevent diffusion of the conductive material from the at least one interconnect.

9. The apparatus of claim 2, further comprising:
at least one interconnect including conductive material; and
an insulating film above the at least one interconnect, the insulating film configured to prevent diffusion of the conductive material from the at least one interconnect.

10. The apparatus of claim 1, wherein the hydrogen supply film provides the hydrogen and/or hydrogen ions during a thermal process to treat the first capacitor at a lower temperature than a temperature for forming the FEOL.

11. The apparatus of claim 10, wherein the hydrogen barrier film prevents the hydrogen and/or hydrogen ions from reaching the second capacitor during the thermal process.

12. The apparatus of claim 10, further comprises:
a first transistor in the FEOL in the memory cell region; and
a second transistor in the FEOL in the peripheral region, wherein
the hydrogen supply film in the BEOL is above the first capacitor and the first and second transistors and provides the hydrogen and/or hydrogen ions during the thermal process to treat the first capacitor and the first and second transistors.

13. The apparatus of claim 8, wherein the hydrogen supply film is above the at least one interconnect.

14. The apparatus of claim 8, wherein the hydrogen supply film is below the at least one interconnect.

15. The apparatus of claim 8 wherein the hydrogen supply film is below the insulating film.

16. The apparatus of claim 15, wherein the barrier film is between the hydrogen supply film and the insulating film.

17. The apparatus of claim 8, wherein the barrier film is above the insulating film.

18. The apparatus of claim 17, wherein the hydrogen supply film is between the insulating film and the barrier film.

19. The apparatus of claim 8, wherein the insulating film includes a material that has a dielectric constant less than a dielectric constant of silicon dioxide.

20. The apparatus of claim 19, wherein the insulating film comprises at least one of carbon-doped silicon oxide (SiOC) or nitrogen-doped silicon carbide (SiCN).

21. The apparatus of claim 8, wherein the second capacitor is above the insulating film.

22. The apparatus of claim 21, wherein the at least one interconnect is a first interconnect and the insulating film is a first insulating film, the apparatus further comprising:
a second interconnect above the second capacitor; and
a second insulating film above the second interconnect.

* * * * *